United States Patent
Lee

(10) Patent No.: US 7,544,567 B2
(45) Date of Patent: Jun. 9, 2009

(54) METHOD OF MANUFACTURING A FLASH MEMORY DEVICE

(75) Inventor: Byoung Ki Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/752,875

(22) Filed: May 23, 2007

(65) Prior Publication Data

US 2008/0081450 A1 Apr. 3, 2008

(30) Foreign Application Priority Data

Sep. 29, 2006 (KR) .................. 10-2006-0096195

(51) Int. Cl.
*H01L 21/336* (2006.01)
(52) U.S. Cl. .................. 438/257; 438/258; 438/275
(58) Field of Classification Search .................. 438/257, 438/258, 261, 275, 279, 287; 257/314, 316, 257/324, 500
See application file for complete search history.

(56) References Cited

U.S. PATENT DOCUMENTS 6,867,453 B2 * 3/2005 Shin et al. .................. 257/314
7,045,850 B2 * 5/2006 Kim et al. .................. 257/314
7,172,940 B1 * 2/2007 Chen et al. .................. 438/258
2007/0281423 A1 * 12/2007 Shih et al. .................. 438/257

FOREIGN PATENT DOCUMENTS

| KR | 10-2001-0063502 A | 7/2001 |
| KR | 10-2002-0029205 A | 4/2002 |
| KR | 10-2006-0011078 A | 2/2006 |
| KR | 10-2006-0046904 A | 5/2006 |

* cited by examiner

*Primary Examiner*—Tuan H Nguyen
(74) *Attorney, Agent, or Firm*—Townsend and Townsend and Crew LLP

(57) ABSTRACT

In a method of manufacturing an SONOS type flash memory device, a first oxide layer and a buffer poly layer are formed over a surface of a semiconductor except for a memory cell region of a cell region. A second oxide layer, a nitride layer and a third oxide layer are formed. The poly buffer layer is exposed by etching specific regions in a peri region and in a DSL/SSL region of the cell region. A conductive layer is formed to electrically connect to the poly buffer layer. The third oxide layer, the nitride layer and the second nitride layer are selectively etched to form a gate of the memory cell region of the cell region. The buffer poly layer is selectively etched to form a gate in the DSL/SSL region of the cell region and a gate in the peri region.

6 Claims, 9 Drawing Sheets

CELL REGION

MC | DSL/SSL

PERI REGION

LV | HV

CELL REGION

PERI REGION

CELL REGION

PERI REGION

CELL REGION

PERI REGION

CELL REGION

PERI REGION

METHOD OF MANUFACTURING A FLASH MEMORY DEVICE

CROSS-REFERENCES TO RELATED APPLICATIONS

The present application claims priority to Korean patent application number 10-2006-96195, filed on Sep. 29, 2006, which is incorporated by reference in its entirety.

BACKGROUND OF THE INVENTION

The present invention relates, in general, to flash memory devices and, more particularly, to a method of manufacturing a Silicon/Oxide/Nitride/Oxide/Silicon (SONOS) type flash memory device.

In general, a cell transistor of a flash memory device has a stacked gate structure. The stacked gate structure has a structure in which a tunnel oxide layer, a floating gate, an inter-gate insulating layer and a control gate electrode are sequentially stacked over a channel region of the cell transistor. In contrast, the gate of a SONOS type flash memory device has a structure in which an oxide layer forming a direct tunneling layer, a nitride layer for storing charges, an oxide layer used as a charge blocking layer, and a conductive layer used as a control gate electrode are sequentially stacked.

Differences between the conventional flash memory and the SONOS flash memory are as follows. First, in terms of the structure, in the conventional flash memory, charges are stored in a floating gate formed from polysilicon, whereas in the SONOS type flash memory, charges are stored in a nitride layer. In other words, the conventional flash memory is disadvantageous in that the retention time of charges is significantly reduced even if minute defects exist in the polysilicon of the floating gate. However, the SONOS type flash memory is advantageous in that the sensitivity to defects is relatively small in terms of the process since the nitride layer is used instead of polysilicon as described above.

Further, the conventional flash memory is limited when implementing a low-voltage operation and a high-speed operation because a tunnel oxide layer of 70 angstroms or more in thickness is used under the floating gate. However, the SONOS type flash memory can easily implement a low-voltage, low-power and high-speed operation because a direct tunneling oxide layer is used under the nitride layer.

Meanwhile, the SONOS type flash memory device has a "dual gate insulating layer structure" in which the gate insulating layer of the cell region is formed to have an Oxide/Nitride/Oxide (ONO) structure and the gate insulating layer of the peri region is formed to have a single silicon oxide layer structure. Furthermore, transistors of a memory cell region and a Drain Select Line/Source Select Line (hereinafter, referred to as "DSL/SSL") region, included in the cell region, are formed at the same time for the simplicity and convenience of the process. Accordingly, the gate oxide layer of the transistor formed in the memory cell region and the DSL/DDL region is formed to have an ONO structure. However, if the ONO structure is used as the gate oxide layer of the transistor formed in the DSL/SSL region, the characteristics of the transistor are degraded because the threshold voltage increases.

SUMMARY OF THE INVENTION

Accordingly, the present invention addresses the above problems, and discloses a method of manufacturing a flash memory device, in which a gate oxide layer of a transistor formed in a DSL/SSL region of a cell region is formed from a single thin oxide layer, thereby preventing the threshold voltage of the transistor formed in the DSL/SSL region of the cell region from increasing.

According to an aspect of the present invention, a method of manufacturing a flash memory device is provided. A semiconductor substrate has a cell region and a peri region. The cell region includes a memory cell region and a DSL/SSL region. The peri region includes a high voltage region and a low voltage region. A first oxide layer and a buffer poly layer are formed over the entire surface except for the memory cell region of the cell region. A second oxide layer, a nitride layer and a third oxide layer are formed over the entire surface. The poly buffer layer is exposed by etching specific regions of the third oxide layer, the nitride layer and the second oxide layer in the DSL/SSL region of the cell region and in the peri region. A conductive layer is formed on the entire surface so that the conductive layer is electrically connected to the poly buffer layer. The third oxide layer, the nitride layer and the second nitride layer are selectively etched to form a gate in the memory cell region of the cell region. The buffer poly layer is selectively etched to form a gate in the DSL/SSL region of the cell region and a gate in the high voltage region and the low voltage region of the peri region.

DESCRIPTION OF SPECIFIC EMBODIMENTS

A specific embodiment according to the present patent will be described with reference to the accompanying drawings.

FIGS. 1A to 9A and 1B to 9B are cross-sectional views illustrating a method of manufacturing a flash memory device according to an embodiment of the present invention. FIGS. 1A to 9A are cross-sectional views illustrating a method of manufacturing a cell region of the flash memory device according to an embodiment of the present invention, and FIGS. 1B to 9B are cross-sectional views illustrating a method of manufacturing a peri region of the flash memory device according to an embodiment of the present invention.

Figure 1A:
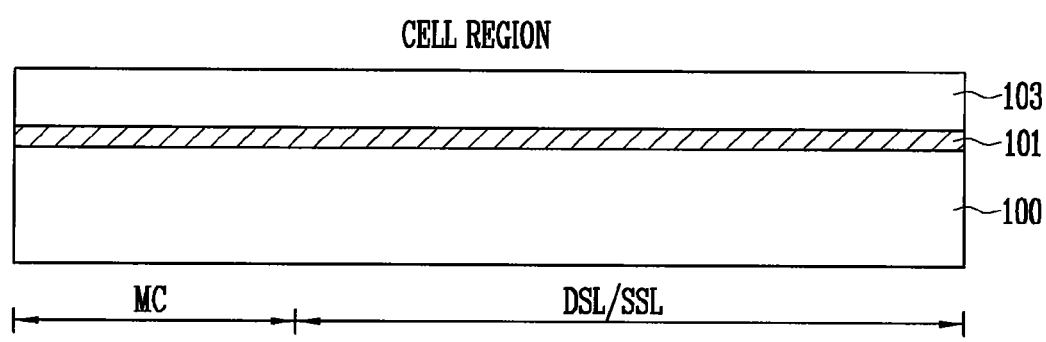
FIGS. 1A to 9B are cross-sectional views illustrating a method of manufacturing a flash memory device according to an embodiment of the present invention.
Figure 1B:
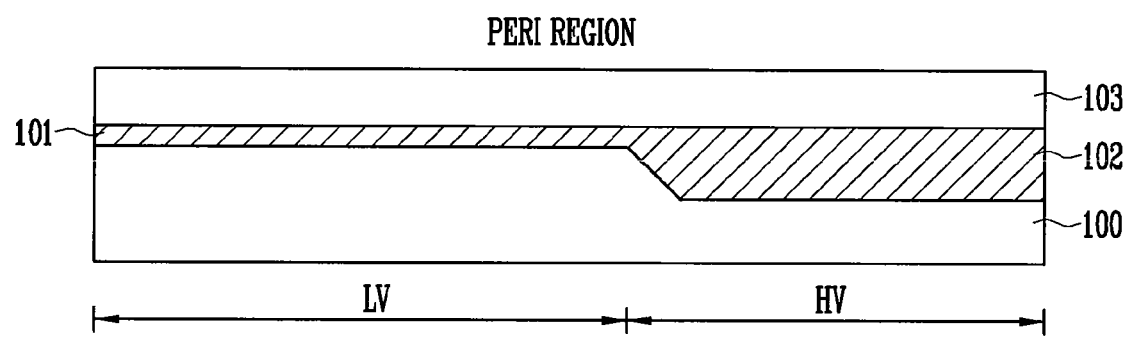

Referring to FIGS. 1A and 1B, a screen oxide layer (not illustrated) is formed on a semiconductor substrate 100. The semiconductor substrate 100 includes a cell region and a peri region. The cell region includes a memory cell region MC and a DSL/SSL region. A variety of threshold voltage (Vt) ion implant processes are performed on the peri region for forming a low voltage region LV, a high voltage region HV, and the like.

A first oxide layer is formed on the semiconductor substrate 100. The first oxide layer includes a low voltage gate oxide layer 101 and a high voltage gate oxide layer 102. A buffer poly layer 103 is then formed on the entire surface.

The low voltage gate oxide layer 101 is formed to a thickness of approximately 40 to approximately 100 angstroms on the low voltage region LV of the peri region and on the memory cell region MC and the DSL/SSL region of the cell region of the semiconductor substrate 100. The high voltage gate oxide layer 102 is formed to a thickness of approximately 300 to approximately 400 angstroms on the high voltage region HV of the peri region. In one embodiment, the low voltage gate oxide layer 101 and the high voltage gate oxide layer 102 are formed from $SiO_2$. In another embodiment, the buffer poly layer 103 is formed to a thickness of approximately 200 to approximately 500 angstroms.

An isolation layer (not illustrated) is then formed by a Self Aligned-Shallow Trench Isolation (SA-STI) process. For example, after a nitride layer (not illustrated) and a hard mask (not illustrated) are formed on the entire surface, exposure and development processes are performed to form a hard mask pattern (not illustrated). An etch process employing the hard mask pattern can be performed to form a trench (not illustrated). A wall oxidization process can be performed to form a sidewall oxide layer (not illustrated) within the trench. An insulating layer (not illustrated) for an isolation layer can be deposited so that the trench is gap filled. A polishing process can then be performed on the entire surface. In one embodiment, the polishing process is a Chemical Mechanical Polishing (CMP) process. The nitride layer (not illustrated) can be removed to form the isolation layer.

Figure 2A:
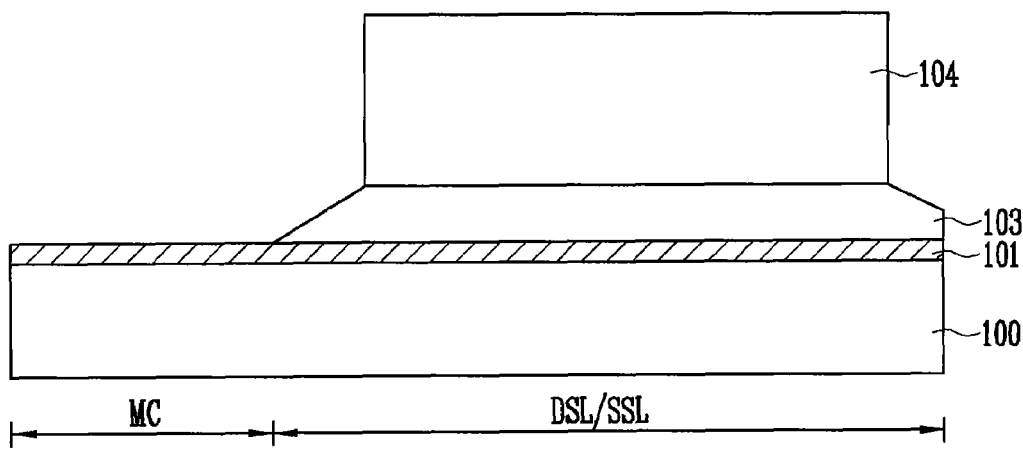
Figure 2B:
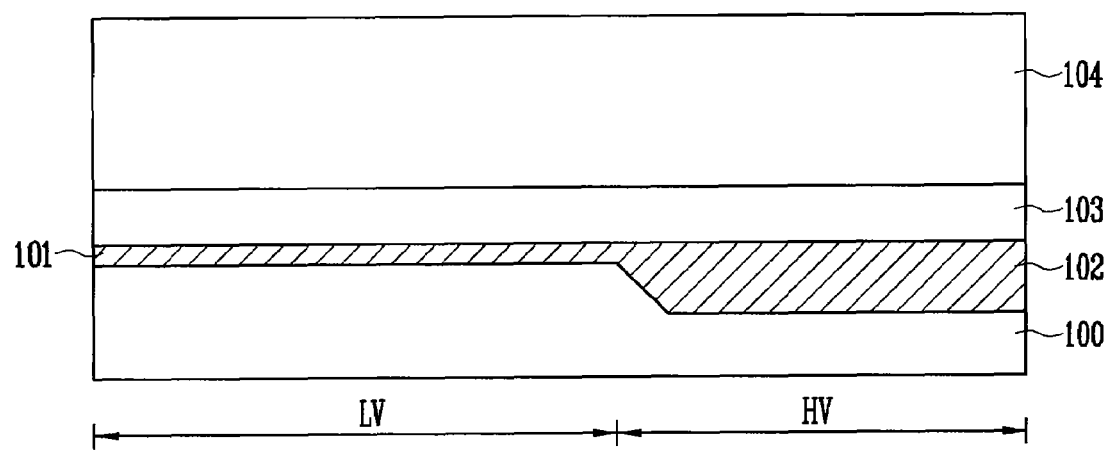

Referring to FIGS. 2A and 2B, a photoresist 104 is formed on the entire surface except for the memory cell region of the cell region. An etch process for removing the buffer poly layer 103 is carried out using the photoresist 104 as a mask. During the etch process, the low voltage gate oxide layer 101 is used as an etch-stop layer.

Figure 3A:
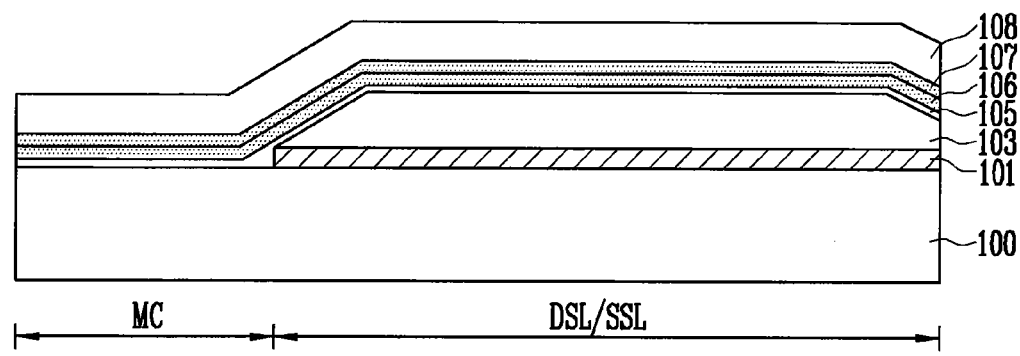
Figure 3B:
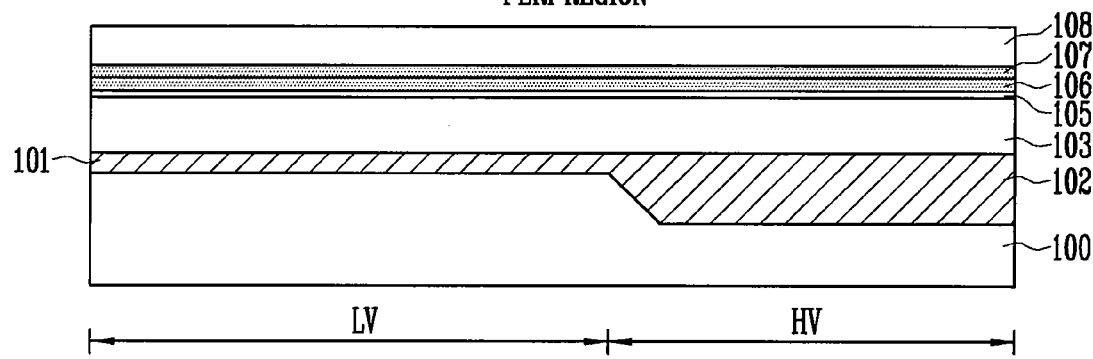

Referring to FIGS. 3A and 3B, after the photoresist 104 is removed, an etch process using the buffer poly layer 103 as an etch mask is performed, removing the low voltage gate oxide layer 101 existing in the memory cell region MC of the cell region. In one embodiment, the low voltage gate oxide layer 101 is removed by wet etch. Thereafter, a second oxide layer 105 serving as a direct tunneling oxide layer, a nitride layer 106 for storing charges, and a third oxide layer 107 for blocking the movement of charges are sequentially formed over the entire surface. A capping layer 108 for protecting the third oxide layer 107 is formed on the third oxide layer 107.

Figure 4A:
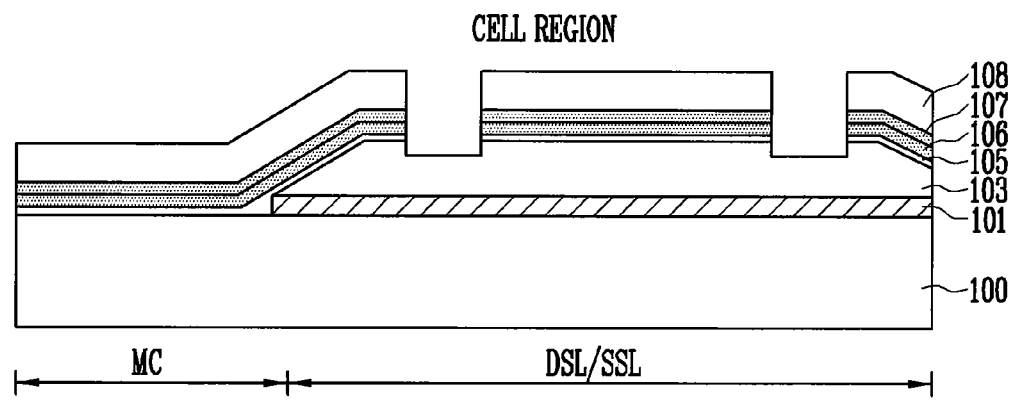
Figure 4B:
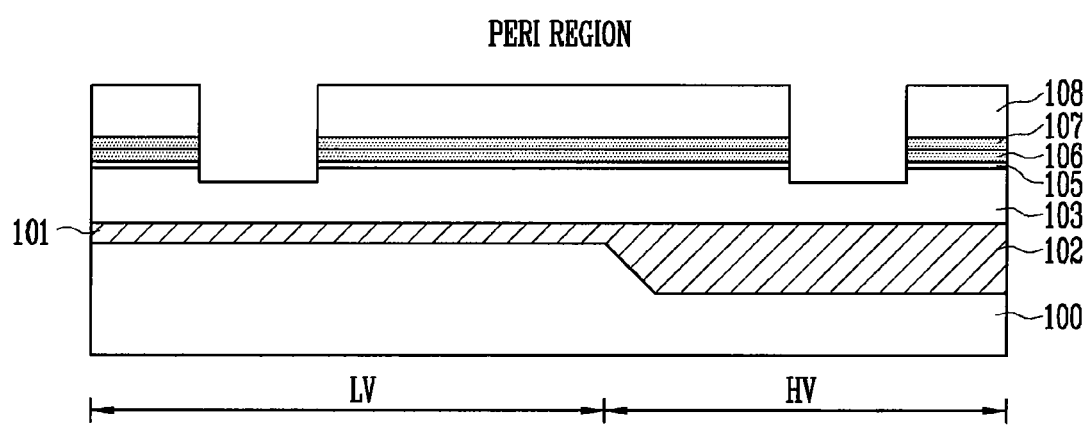

Referring to FIGS. 4A and 4B, in the DSL/SSL region of the cell region, and in the high voltage region HV and the low voltage region LV of the peri region, the capping layer 108, the third oxide layer 107, the nitride layer 106 and the second oxide layer 105 are etched to partially expose a region of the buffer poly layer 103.

Figure 5A:
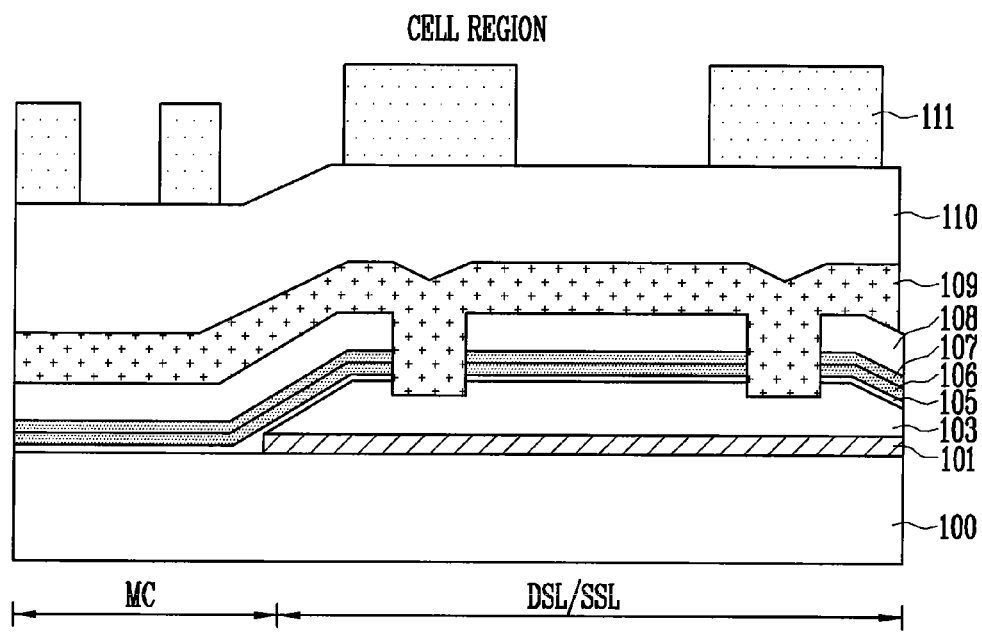
Figure 5B:
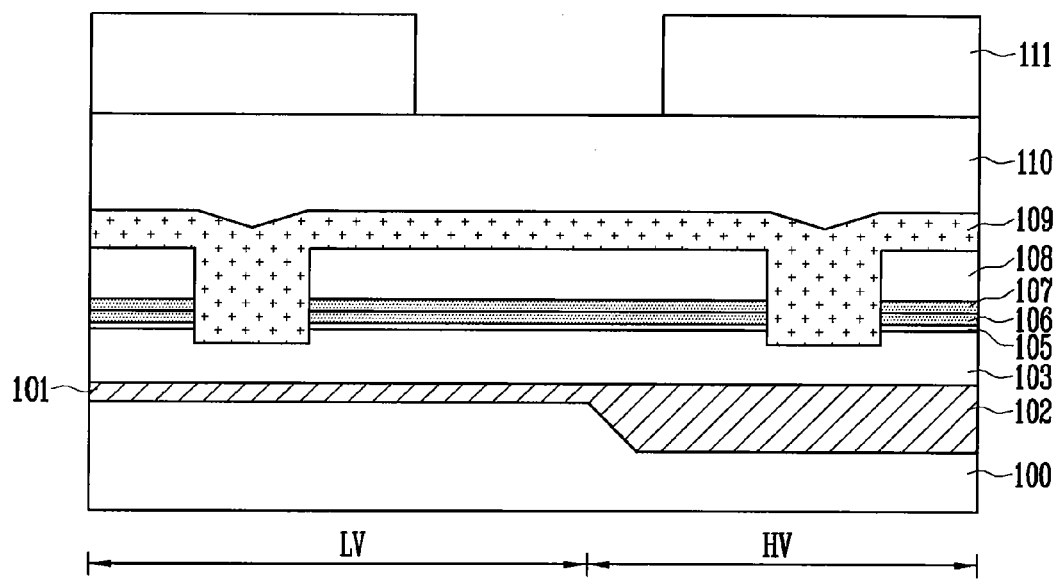

Referring to FIGS. 5A and 5B, a conductive layer 109 is formed on the entire surface. Consequently, the conductive layer 109 is electrically connected to the underlying buffer poly layer 103 through the portion from which the capping layer 108, the third oxide layer 107, the nitride layer 106 and the second oxide layer 105 are etched in the DSL/SSL region of the cell region and in the high voltage region HV and the low voltage region LV of the peri region.

Thereafter, a hard mask 110 is formed and a photoresist is coated on the entire surface. An exposure process and a development process using a photo mask (not illustrated) are then sequentially performed. Thus, a photoresist pattern 111 through which a specific region of the hard mask 110 is exposed is formed.

Figure 6A:
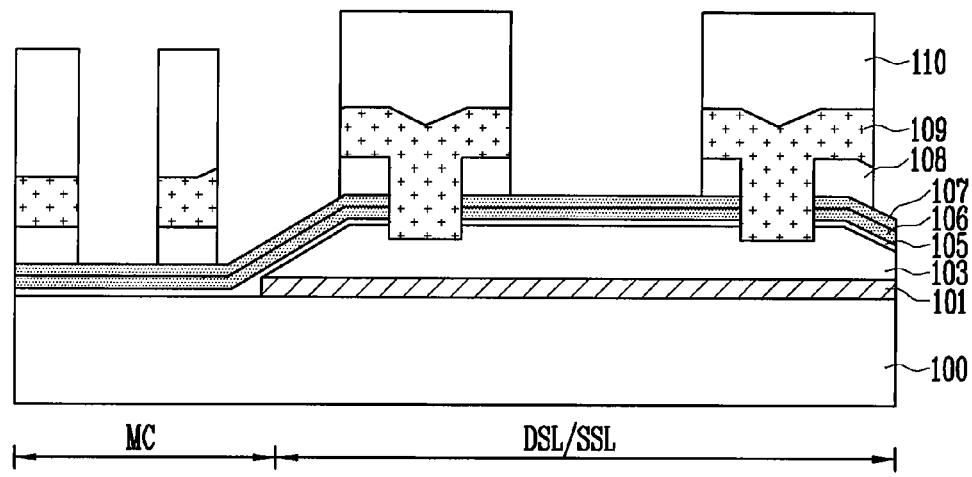
Figure 6B:
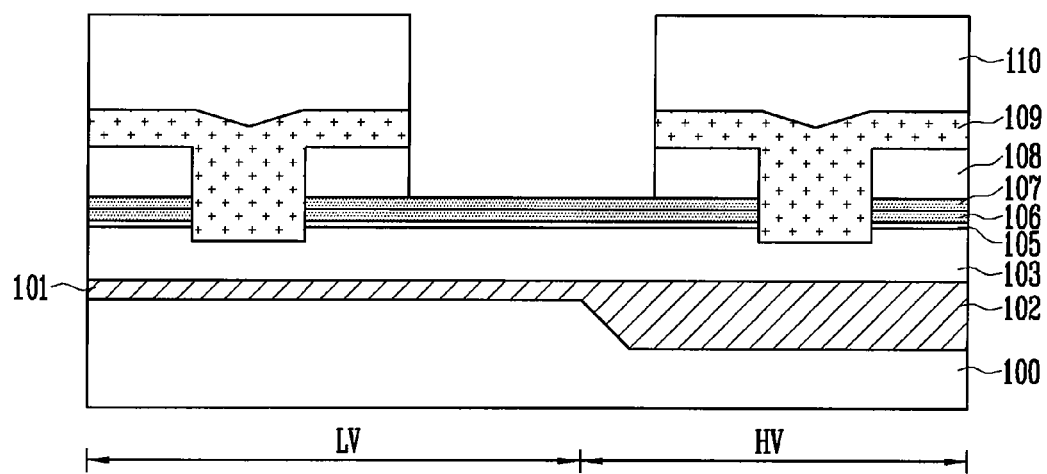

Referring to FIGS. 6A and 6B, an etch process using the photoresist pattern 111 as an etch mask is performed to etch a specific region of the hard mask 110. The photoresist pattern 111 is removed and a cleaning process is then carried out.

The conductive layer 109 and the capping layer 108 are etched and patterned by means of an etch process using the hard mask 110 as an etch mask. In the etch process, the third oxide layer 107 serves as an etch-stop layer.

Figure 7A:
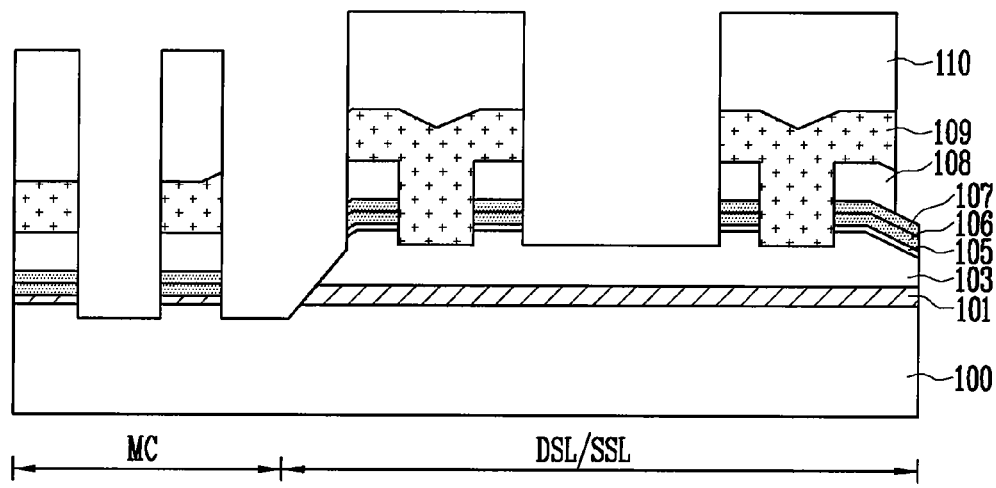
Figure 7B:
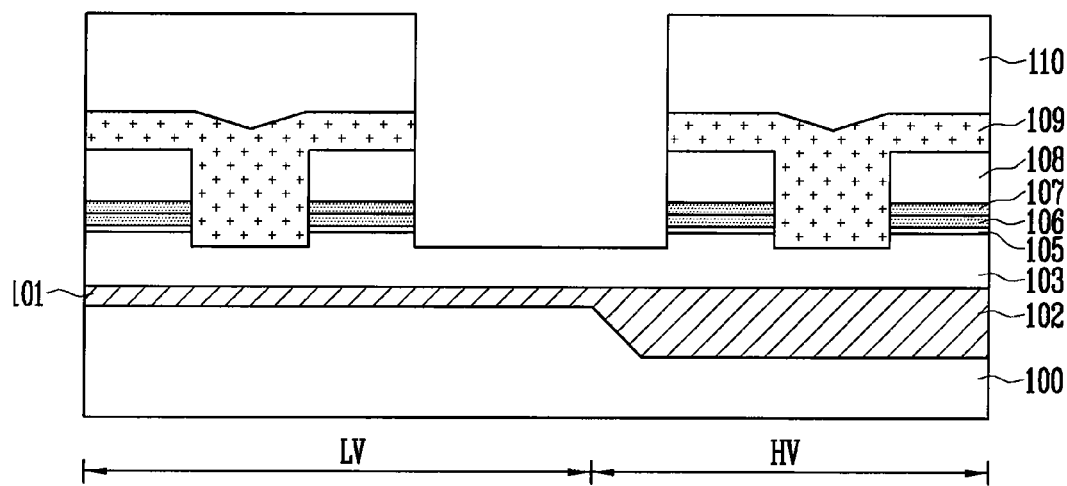

Referring to FIGS. 7A and 7B, the third oxide layer 107, the nitride layer 106 and the second oxide layer 105 are etched and patterned by an etch process using the hard mask 110 as an etch mask. Therefore, a gate is completely formed in the memory cell region MC of the cell region.

Figure 8A:
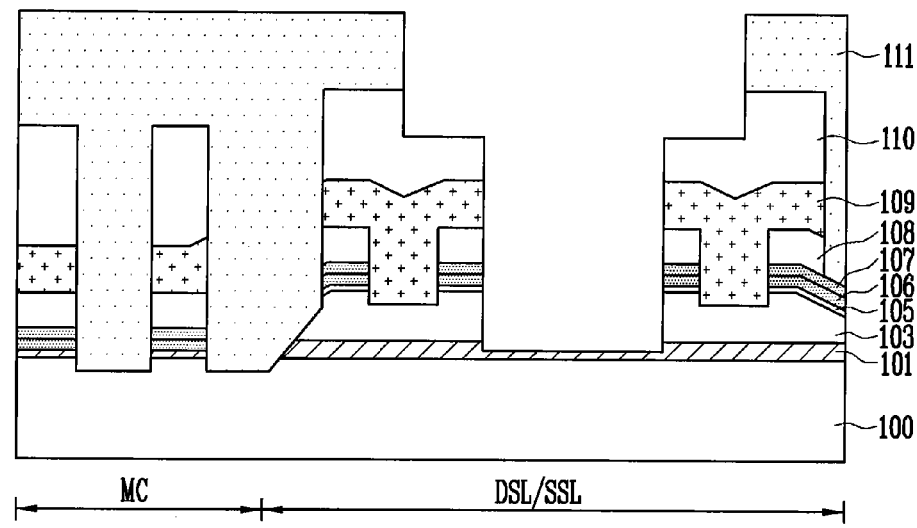
Figure 8B:
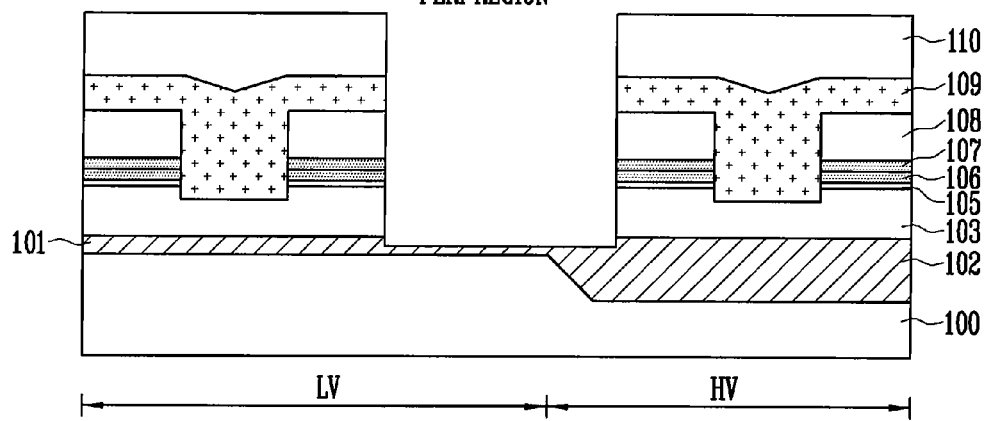

Referring to FIGS. 8A and 8B, a mask 111 is formed to partially expose the DSL/SSL region of the cell region, and to partially expose the high voltage region HV and the low voltage region LV of the peri region. The exposed region of the buffer poly layer 103 is etched and patterned by an etch process using the mask 111 as an etch mask. Consequently, the formation of the gate in the DSL/SSL region of the cell region, and the gate in the high voltage region HV and the low voltage region LV of the peri region is completed.

Figure 9A:
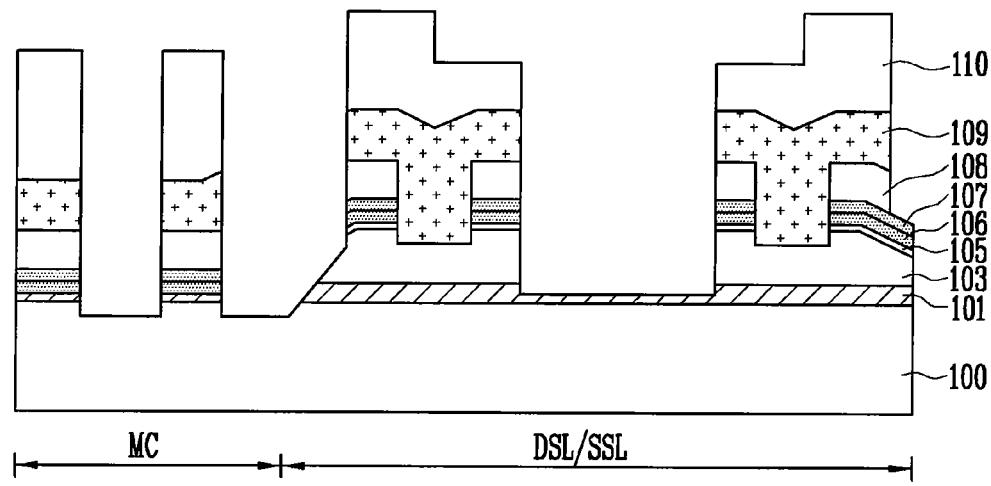
Figure 9B:
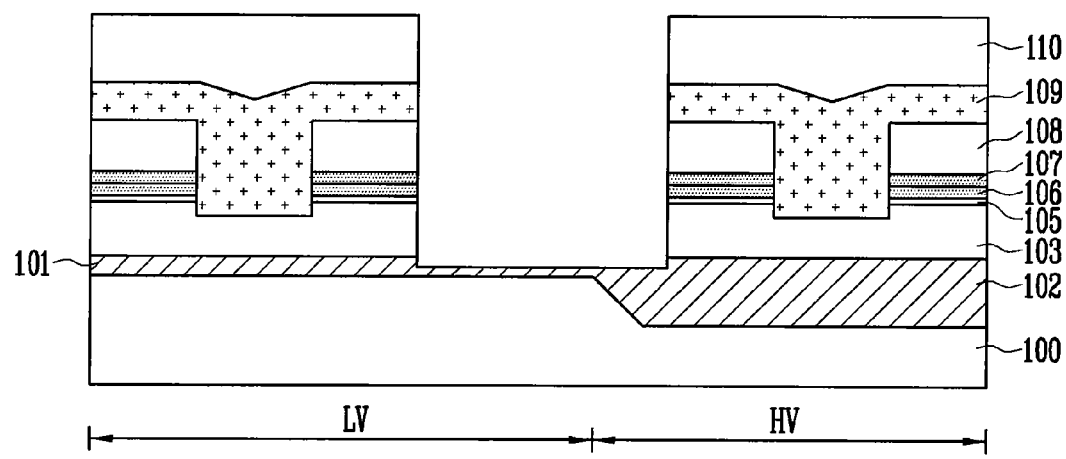

Referring to FIGS. 9A and 9B, by removing the mask 111, the flash memory device according to an embodiment of the present invention is completed.

As described above, in accordance with the method of manufacturing a flash memory device according to an embodiment of the present invention, the gate oxide layer of the transistor formed in the DSL/SSL region of the cell region is formed using a single thin oxide layer. It is therefore possible to prevent the threshold voltage of the transistor from increasing. Accordingly, the characteristics of the transistor formed in the DSL/SSL region of the cell region can be prevented from degrading.

Although the foregoing description has been made with reference to a specific embodiment, it is to be understood that changes and modifications of the present patent may be made by one having ordinary skill in the art without departing from the spirit and scope of the present patent and appended claims.

What is claimed is:

1. A method of manufacturing a flash memory device, comprising:

providing a semiconductor substrate comprising a cell region and a peri region, the cell region including a memory cell region and a Drain Select Line/Source Select Line (DSL/SSL) region, the peri region including a high voltage region and a low voltage region;

forming a first oxide layer and a buffer poly layer over the surface of the semiconductor substrate except for the memory cell region of the cell region;

forming a second oxide layer, a nitride layer and a third oxide layer over the surface of the first oxide layer and the memory cell region of the cell region;

exposing the poly buffer layer by etching specific regions of the third oxide layer, the nitride layer and the second oxide layer in the peri region and in the DSL/SSL region of the cell region;

forming a conductive layer so that the conductive layer is electrically connected to the poly buffer layer;

selectively etching the third oxide layer, the nitride layer and the second oxide layer to form a gate in the memory cell region of the cell region; and selectively etching the buffer poly layer to form a gate in the DSL/SSL region of the cell region and a gate in the high voltage region and the low voltage region of the peri region.

2. The method of claim 1, wherein the step of forming the first oxide layer comprises:

forming a first oxide layer on the surface of the semiconductor substrate;

forming a buffer poly layer on the first oxide layer;

removing the buffer poly layer from the memory cell region of the cell region; and removing a low voltage gate oxide layer existing in the memory cell region of the cell region by an etch process using the buffer poly layer as an etch mask.

3. The method of claim 2, wherein the first oxide layer includes the memory cell region of the cell region, the DSL/SSL region of the cell region, the low voltage gate oxide layer formed in the low voltage region of the peri region, and a high voltage gate oxide layer formed in the high voltage region of the peri region.

4. The method of claim 3, wherein the low voltage gate oxide layer is formed using a $SiO_2$ layer having a thickness of approximately 40 to approximately 100 angstroms.

5. The method of claim 3, wherein the high voltage gate oxide layer is formed using a $SiO_2$ layer having a thickness of approximately 300 to approximately 400 angstroms.

6. The method of claim 2, wherein the buffer poly layer is formed to have a thickness of approximately 200 to approximately 500 angstroms.

* * * * *